(12) United States Patent
Namba

(10) Patent No.: US 12,304,200 B2
(45) Date of Patent: May 20, 2025

(54) IMPRINT APPARATUS, METHOD OF CONTROLLING IMPRINT APPARATUS, AND STORAGE MEDIUM

(71) Applicant: CANON KABUSHIKI KAISHA, Tokyo (JP)

(72) Inventor: Hisashi Namba, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 171 days.

(21) Appl. No.: 18/167,773

(22) Filed: Feb. 10, 2023

(65) Prior Publication Data

US 2023/0256731 A1 Aug. 17, 2023

(30) Foreign Application Priority Data

Feb. 15, 2022 (JP) ................. 2022-021373

(51) Int. Cl.
*B41J 2/045* (2006.01)
*B41J 2/21* (2006.01)
*B41J 25/00* (2006.01)
*G03F 7/00* (2006.01)

(52) U.S. Cl.
CPC ......... *B41J 2/0451* (2013.01); *B41J 2/04581* (2013.01); *B41J 2/04586* (2013.01); *B41J 2/2139* (2013.01); *B41J 2/2142* (2013.01); *B41J 25/001* (2013.01); *G03F 7/0002* (2013.01)

(58) Field of Classification Search
CPC .. B41J 2/0451; B41J 2/04586; B41J 2/04581; B41J 2/2139; B41J 2/2142; B41J 25/001; G03F 7/0002
See application file for complete search history.

(56) References Cited

U.S. PATENT DOCUMENTS

| | | | | |
|---|---|---|---|---|
| 6,520,623 | B2 * | 2/2003 | Miyake | B41J 2/2139 347/40 |
| 2003/0103100 | A1 * | 6/2003 | Vanhooydonck | G06K 15/105 347/41 |

FOREIGN PATENT DOCUMENTS

JP 2019136926 A 8/2019

* cited by examiner

*Primary Examiner* — Yaovi M Ameh
(74) *Attorney, Agent, or Firm* — Canon U.S.A., Inc. IP Division

(57) ABSTRACT

Imprint apparatus includes: a discharge-unit including a nozzle-array that plurality of nozzles are arranged in a nozzle-array-direction, a moving-unit to move relative-positions of a substrate and the discharge-unit, and a discharge-control-unit control to apply a resin to the substrate by applying a resin from a nozzle corresponding to a predetermined-cycle in the nozzle-array-direction in the discharge-unit and by moving the relative-positions by the moving-unit, the imprint apparatus including an identifying-unit to identify a discharging defective-nozzle in the discharge-unit and a complementing-unit to, if the nozzle corresponding to the predetermined-cycle includes a discharging-defective-nozzle, complement the discharging-defective-nozzle with an alternative-nozzle near the discharging-defective-nozzle, wherein the complementing-unit determines a nozzle to be used for discharge so that there is at least one location where a cycle of nozzles applying a resin in the nozzle-array-direction is n−1 if the predetermined-cycle is n, and the resin is applied to another location in the predetermined-cycle n.

12 Claims, 10 Drawing Sheets

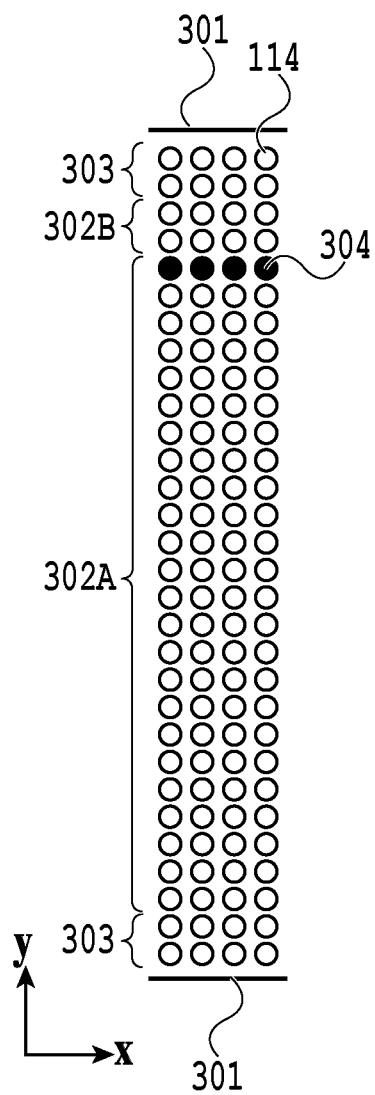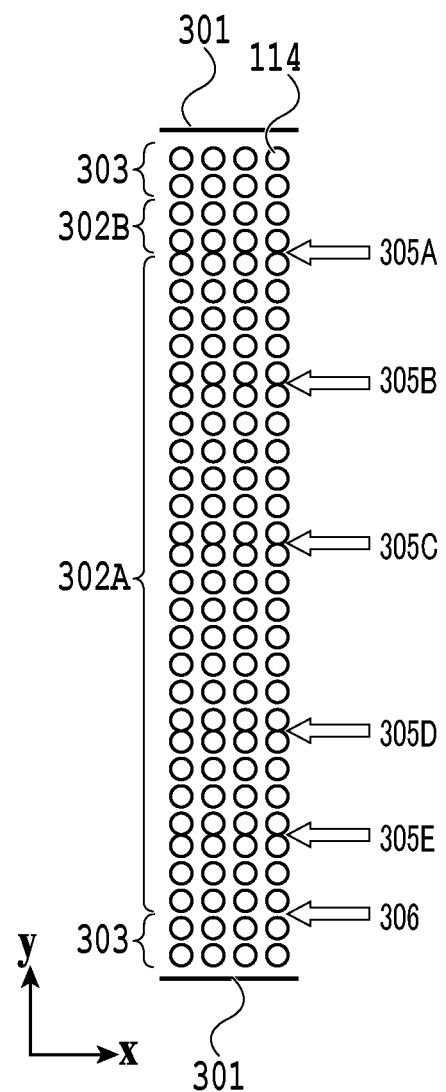
FIG.9A FIG.9B

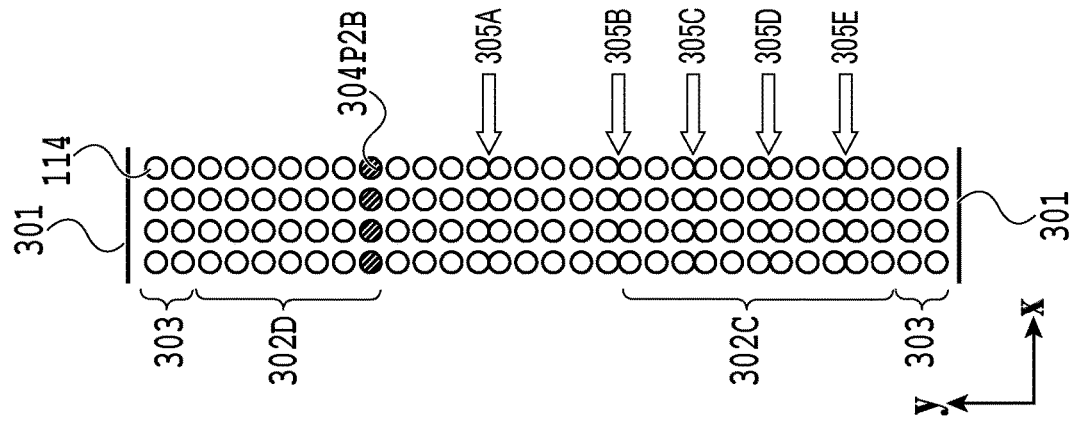
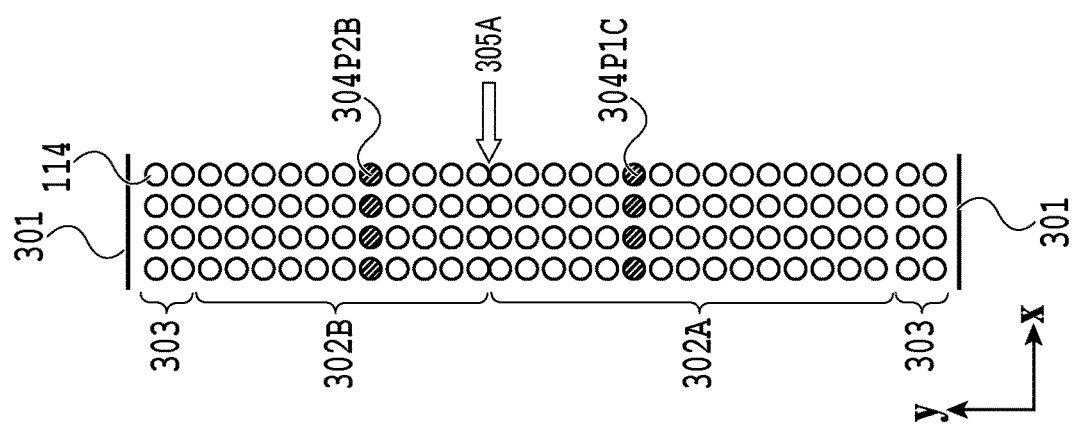
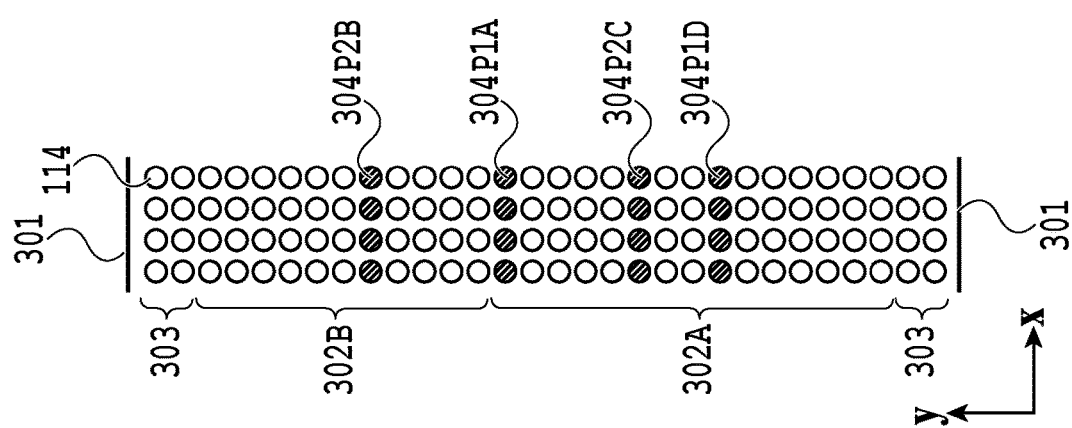
FIG.10C
FIG.10B
FIG.10A

IMPRINT APPARATUS, METHOD OF CONTROLLING IMPRINT APPARATUS, AND STORAGE MEDIUM

BACKGROUND

Field of the Disclosure

The present disclosure generally relates to a technique for complementing a discharge failure nozzle in an imprint apparatus.

Description of the Related Art

An imprint technique is conventionally known as a technique for pattern forming on a substrate. The imprint technique allows a resin pattern to be formed on a substrate by applying an uncured resin onto the substrate and pressing a mold to fill the resin. Further, some nozzles for discharging a resin onto a substrate include one formed of an inkjet module.

Japanese Patent Laid-Open No. 2019-136926 (hereinafter referred to as Patent Literature 1) discloses a technique, in a case where a discharge nozzle including an inkjet module is defective, for complementing the defective nozzle with a near nozzle.

However, the complementing method using the near nozzle disclosed in Patent Literature 1 causes a location where a distance between applied resins may be widened by complementing the defective nozzle with the near nozzle. Since filling a portion with a wide resin interval is slow in the case of pressing the mold against the portion, time required for imprinting is prolonged, and as a result, there is a possibility of a decrease in productivity.

SUMMARY

An imprint apparatus according to one embodiment of the present disclosure comprises a discharge unit including a nozzle array in which a plurality of nozzles are arranged in a nozzle array direction, a moving unit configured to move relative positions of a substrate and the discharge unit, and a discharge control unit configured to perform control so as to apply a resin to the substrate by applying a resin from a nozzle corresponding to a predetermined cycle in the nozzle array direction in the discharge unit and by moving the relative positions by the moving unit, the imprint apparatus comprising an identifying unit configured to identify a discharging defective nozzle in the discharge unit and a complementing unit configured to, in a case where the nozzle corresponding to the predetermined cycle includes a discharging defective nozzle, complement the discharging defective nozzle with an alternative nozzle near the discharging defective nozzle, wherein the complementing unit determines a nozzle to be used for discharge so that there is at least one location where a cycle of nozzles applying a resin in the nozzle array direction is n−1 in a case where the predetermined cycle is n, and the resin is applied to another location in the predetermined cycle n.

Further features of the present disclosure will become apparent from the following description of embodiments with reference to the attached drawings.

BRIEF DESCRIPTION OF THE DRAWINGS

FIGS. 9A and 9B are diagrams showing a method of complementing a discharging defective nozzle; and FIGS. 10A to 10C are diagrams showing a method of complementing a discharging defective nozzle.

DESCRIPTION OF THE EMBODIMENTS

First Embodiment

Description of an Imprint Apparatus

Figure 1:
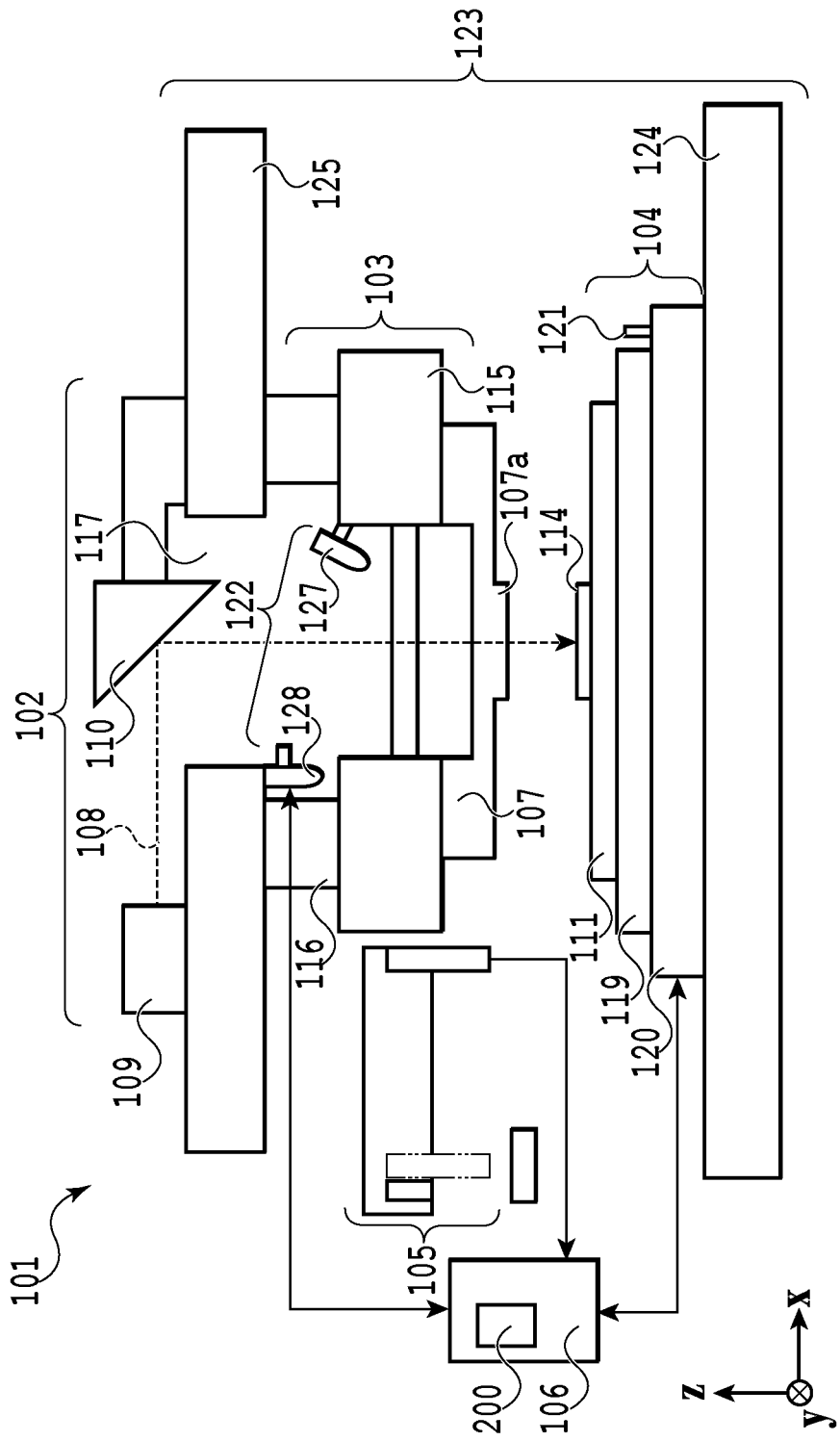
FIG. 1 is a diagram showing an outline of an imprint apparatus.

FIG. 1 is a diagram illustrating an outline of an imprint apparatus. An imprint apparatus 101 is an apparatus for imprinting a resin supplied onto a substrate with a mold and applying energy for curing to the resin to form a pattern of a cured product to which an uneven pattern of the mold is transferred. Details of the imprint apparatus 101 will be described with reference to FIG. 1.

The imprint apparatus 101 includes a light irradiation portion 102, an imprint portion 103, a substrate stage 104, a discharge unit 105, a control unit 106, an acquisition unit 122, and a housing 123.

The light irradiation portion 102 irradiates the mold 107 with an ultraviolet ray 108 during imprint processing. The light irradiation portion 102 includes a light source 109 and an optical element 110 for correcting the ultraviolet ray 108 irradiated from the light source 109 to suitable light for imprint processing.

The imprint portion 103 includes a mold chuck 115 that attracts and holds the mold 107 by vacuum attraction force or electrostatic force and a mold drive mechanism 116 that holds the mold chuck 115 and moves the mold 107 held by the mold chuck 115. The mold chuck 115 and the mold drive mechanism 116 include an opening region 117 in the center so that a substrate 11 is irradiated with the ultraviolet ray 108 irradiated from the light source 109. The mold drive mechanism 116 moves the mold 107 in a Z-axis direction so as to selectively press the mold 107 against a resin 114 on the substrate 111 or separate the mold 107 from the resin 114.

The substrate 111 is, for example, a single crystal silicon substrate or a Silicon on Insulator (SOI) substrate. The resin 114 is applied to a surface to be processed of the substrate 111. The resin 114 is molded by a pattern portion 107a formed on the mold 107. The resin 114 is a photo-setting resin having a property of being cured by receiving the ultraviolet ray 108 and is appropriately selected according to various conditions such as a semiconductor device manufacturing process.

The substrate stage 104 holds the substrate 111 and aligns the mold 107 with the resin 114 at the time of pressing the mold 107 against the resin 114 on the substrate 111. The substrate stage 104 includes a substrate chuck 119 that holds the substrate 111 by vacuum attraction and a substrate stage housing 120 that holds the substrate chuck 119 by a mechanical means and is movable within an XY plane. The substrate stage 104 also includes a stage substrate mark 121. The stage substrate mark 121 is used for aligning the molds 107 on a surface of the substrate chuck 119. The substrate stage housing 120 may employ, for example, a linear motor as an actuator.

The discharge unit 105 includes a discharge portion 10, and the discharge portion 10 includes a nozzle array in which a plurality of nozzles are arranged in a nozzle array direction (Y direction). A discharge head discharges the uncured resin 114 in a liquid state from a nozzle to apply the resin onto the substrate 111. The present embodiment employs a method of pushing out the resin 114 from the nozzle using the piezoelectric effect of a piezoelectric element. A control unit 106 to be described later generates a drive waveform for driving the piezoelectric element and drives the piezoelectric element so as to deform the piezoelectric element into a shape suitable for discharge. A plurality of nozzles are provided, each of which can be controlled independently. The amount of the resin 114 discharged from the discharge nozzle of the discharge unit 105 is appropriately determined according to a desired thickness of the resin 114 formed on the substrate 111, the density of a pattern to be formed, and the like.

The acquisition unit 122 includes an alignment measuring instrument 127 and an observation measuring instrument 128. The alignment measuring instrument 127 measures a misalignment in each of X-axis and Y-axis directions between an alignment mark formed on the substrate 111 and an alignment mark formed on the mold 107. The observation measuring instrument 128 is an image capturing device such as a CCD camera and acquires a pattern of the resin 114 discharged onto the substrate 111 as image information.

The control unit 106 may control the operation and correction of each component of the imprint apparatus 101. The control unit 106 includes, for example, a computer having a CPU, ROM, RAM, etc., is connected to each component of the imprint apparatus 101 via a line, and may execute the function of each component according to a program or the like. It should be noted that the CPU (a central processing unit or a processor) controls the computer centrally and, for example, reads out a program stored in the ROM to the RAM (a working memory for temporarily storing various kinds of information during execution of the program) to perform execution. This implements operations according to the present embodiment. The control unit 106 of the present embodiment may control discharge based on measurement information from the acquisition unit 122. That is, the operations of the imprint portion 103, the substrate stage 104, and the discharge unit 105 may be controlled. It should be noted that the control unit 106 may be formed integrally with another portion of the imprint apparatus 101 or may be formed separately. The control unit 106 may also include a plurality of computers instead of a single computer.

The housing 123 includes a base surface plate 124 on which the substrate stage 104 is placed, a bridge surface plate 125 fixing the imprint portion 103, and a column (not shown) that extends from the base surface plate 124 and supports the bridge surface plate 125. The imprint apparatus 101 also includes a mold conveyance mechanism (not shown) that conveys the mold 107 from outside the apparatus to the imprint portion 103 and a substrate conveyance mechanism (not shown) that conveys the substrate 111 from outside the apparatus to the substrate stage 104.

A discharge abnormality which is a discharging defect in a nozzle is detected by a nozzle abnormality detection unit 200. In order to detect a discharge abnormality in a nozzle, in the case of the piezoelectric discharge unit 105, a pulse-like voltage is applied to a piezoelectric element to vibrate a vibration plate, and analyzing a response waveform makes it possible to grasp a state inside a flow path and determine whether the nozzle is abnormal. Alternatively, applying the resin 114 on the substrate 111 with the discharge unit 105 to measure the position of the applied resin 114 also makes it possible to detect which nozzle is abnormal.

Imprint Processing

Next, a description will be given of imprint processing by the imprint apparatus 101. In the present embodiment, imprint processing refers to a discharge operation and an imprint operation to be described below. The control unit 106 places and fixes the substrate 111 on the substrate chuck 119 on the substrate stage 104 with the substrate conveyance mechanism, and moves the substrate stage 104 to the application position of the discharge unit 105. Then, as an application process, the discharge unit 105 applies the resin 114 to a pattern formation region, which is a predetermined region to be processed in the substrate 111, based on the drive waveform generated by the control unit 106.

Next, the control unit 106 moves the substrate stage 104 so that the pattern formation region on the substrate 111 is positioned directly below the pattern portion 107a formed on the mold 107. The control unit 106 subsequently drives the mold drive mechanism 116 to press the mold 107 against the resin 114 on the substrate 111 as a mold-pressing process. The resin 114 is filled into an uneven portion in the pattern portion 107a by this mold-pressing process. In this state, the control unit 106 causes the light irradiation unit 102 to irradiate the ultraviolet ray 108 from the upper surface of the mold 107 to cure the resin 114 with the ultraviolet ray 108 transmitted through the mold 107 as a curing process. Then, as a mold release process, after the resin 114 is cured, the control unit 106 drives the mold drive mechanism 116 to separate the mold 107 from the resin 114. As a result, a three-dimensional pattern of the resin 114 imitating the uneven portion of the mold 107 is molded on the surface of the pattern formation region on the substrate 111. The discharge operation and imprint operation will be described below with reference to the drawings.

Discharge Operation

Figure 2:
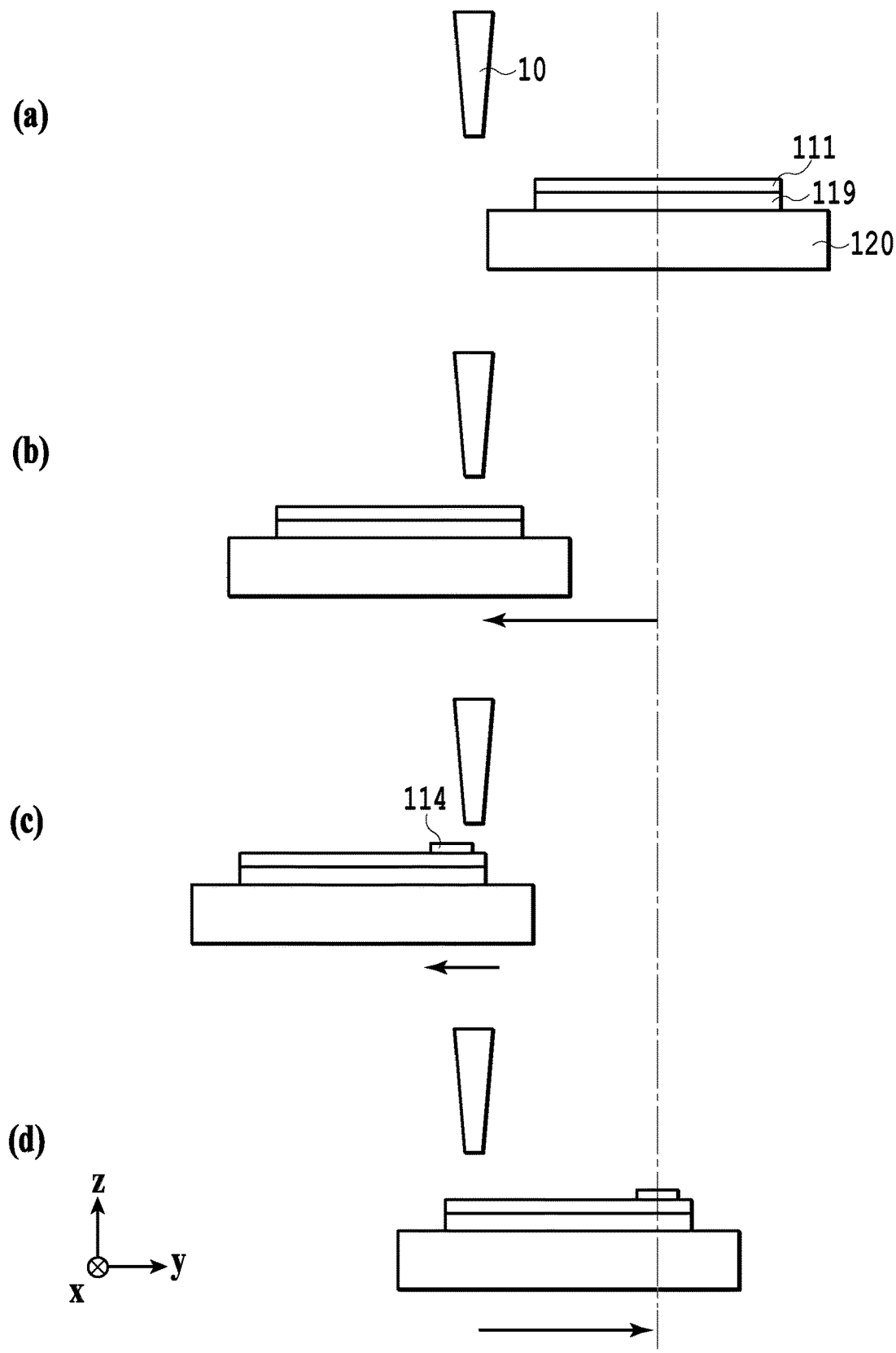
FIG. 2 is a diagram showing a discharge operation.

FIG. 2 is a diagram showing the discharge operation by the discharge unit 105. A dotted line in FIG. 2 indicates a position of imprint by the mold 107. (a) to (d) of FIG. 2 show an example in which the resin 114 is discharged in a predetermined field (discharge region) by performing discharge from the discharge portion 10 while the substrate stage 104 moves in a stage movement direction (the y direction in this example). A state is shown where, during the discharge operation, the position of the substrate stage 104 changes while the position of the discharge portion 10 does not change.

(a) of FIG. 2 shows the positions of the discharge portion 10 and the substrate stage 104 at the start of the discharge operation. (b) of FIG. 2 shows a state where the substrate stage 104 is moved at a constant speed and a discharge start position in the discharge region on the substrate 111 is located in the lower portion of the discharge portion 10 in the gravitational direction. At the timing of (b), the discharge portion 10 starts discharge. The substrate stage 104 keeps moving while maintaining a constant speed operation, starts deceleration after reaching a discharge completion position shown in (c) of FIG. 2, and stops. On the other hand, the discharge portion 10 completes the discharge operation. As a result, the discharge operation to the discharge region is completed. In the present embodiment, the relative positions of the substrate 111 and the discharge portion 10 are moved by moving the substrate stage 104 without changing the position of the discharge portion 10. However, the present disclosure is not limited to this, and the substrate stage 104 may be fixed to move the discharge portion 10.

Imprint Operation

Next, in order to perform an imprint operation, the substrate stage 104 is turned back and moved so that the position of the discharge region corresponds to an imprint position as shown in (d) of FIG. 2. At this time, the resin 114 can be discharged at a higher density by executing the discharge operation on a return path side as well.

Thereafter, the mold 107 (not shown in (a) to (d) of FIG. 2) is lowered to be impressed on the discharge region in the substrate 111. Then, the discharge region is irradiated with the light source 109 to cure the resin 114. After curing, the mold 107 is raised to complete pattern formation. In a case where a pattern is formed on the entire surface of the substrate 111, such a discharge operation and an imprint operation are repeatedly performed. It should be noted that for the sake of explanation, (a) to (d) of FIG. 2 show an example in which the discharge operation is performed in one field (the discharge region and the imprint region) and the imprint operation is performed in the field. In the present embodiment, as will be described later, the imprint operation is continuously performed after the discharge operation is continuously performed in a plurality of fields.

Comparative Example

Figure 3B:
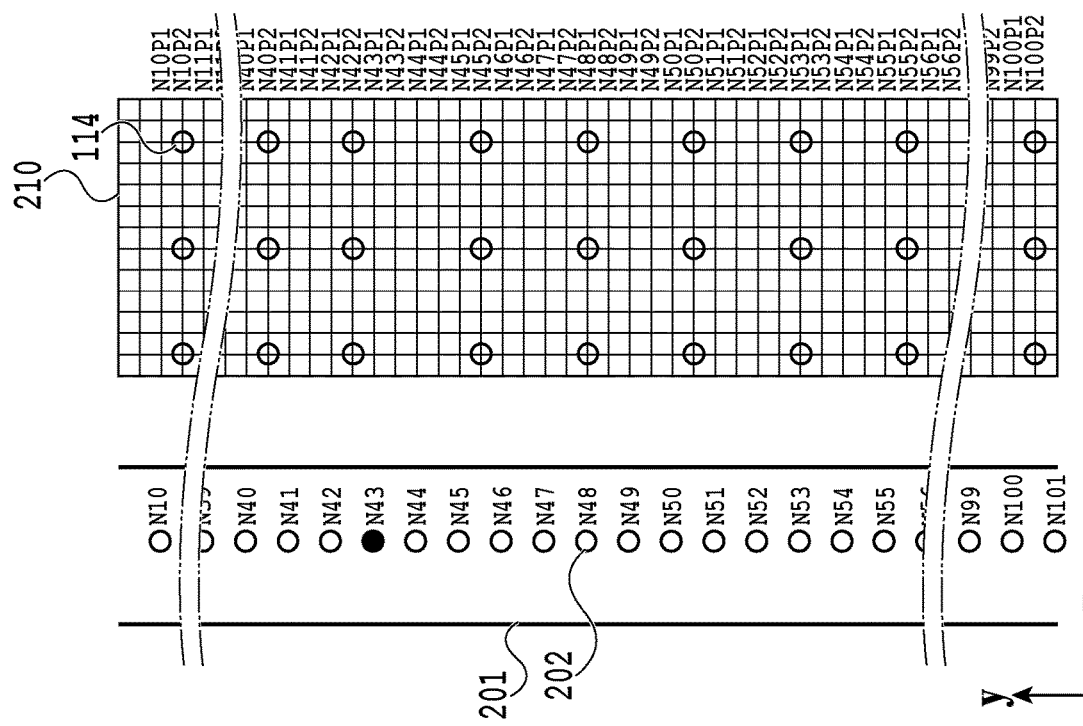
FIGS. 3A and 3B are diagrams showing a method of complementing a discharging defective nozzle with an adjacent nozzle in a comparative example.
Figure 3A:
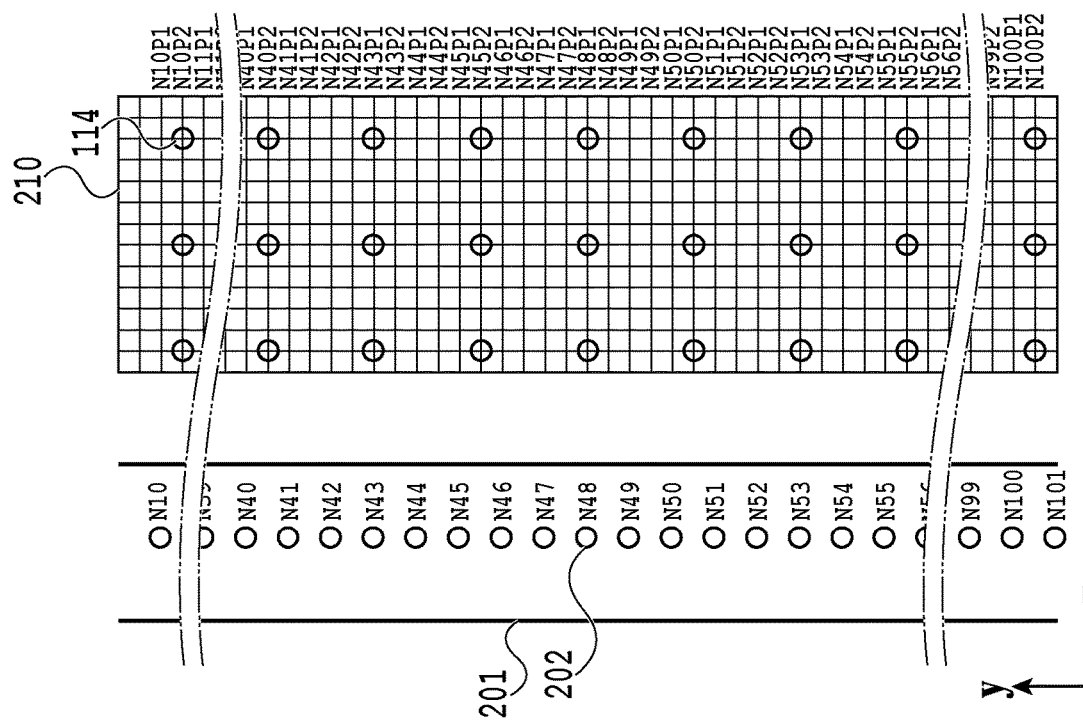

FIGS. 3A and 3B are diagrams illustrating a comparative example different from the example explained in the present embodiment and are diagrams illustrating a method of complementing an abnormal nozzle (discharging defective nozzle) with a near normal alternative nozzle. First, FIG. 3A shows an example of a case where the resin 114 is applied onto the substrate 111. A large number of nozzle apertures 202 are arranged on an application portion surface 201 of the discharge unit 105. FIGS. 3A and 3B show nozzle apertures as N1 to N101 starting from a +y direction side. A lattice 210 in which a resist can be arranged on the substrate 111 is also shown. For example, in the case of arranging the resin 114 at 1200 dpi, the lattice 210 has an interval of one grid=21.167 μm. A case will be described where the resin 114 is applied onto the lattice 210 at intervals of five grids (105.835 μm) in a nozzle array direction (y direction). In the present embodiment, the number of passes of a nozzle in the case of applying a resin is two (the stage reciprocates, and the resin is applied through the two scans of a forward path and a return path).

The nozzle apertures 202 are arranged in the y direction at intervals of 42.333 μm. Since an interval in the lattice 210 is 21.167 μm, the substrate stage 104 first applies the resin 114 while moving in a −x direction. Then, the substrate stage 104 moves by one grid (21.167 μm) in a +y direction and applies the resin 114 while moving in a +x direction.

FIGS. 3A and 3B illustrate, on the right of the lattice 210, a discharge nozzle number at each point and a number indicating whether the resin 114 is applied in the forward path (P1) or the return path (P2) of the substrate stage 104. For example, a nozzle denoted as N10P1 means that nozzle number N10 applies the resin 114 in the forward path P1. A nozzle denoted as N10P2 means that nozzle number N10 applies the resin 114 in the return path (P2). In the case of applying the resin 114 at a 5-grid interval in the +y direction, nozzles N43, N48, and N53 shown in FIGS. 3A and 3B apply the resin 114 in the forward path (P1) and nozzles N40, N45, N50, and N55 apply the resin 114 onto the substrate 111 in the return path (P2).

FIG. 3B is a diagram illustrating the nozzle complementing method according to the comparative example. In a case where the resin 114 cannot be applied from a certain nozzle, a streak-like unapplied region is formed in a stage scanning direction and in a case where imprinting is performed in that state, the unapplied region cannot be filled with a resin sufficiently up to the inside of the pattern of the mold. As a result, a resin pattern cannot be normally transferred onto the substrate 111. This is referred to as a defect due to unfilled resin (hereinafter, unfilled defect). To prevent the unfilled defect, there is a method of complementing an abnormal nozzle with an adjacent nozzle. A description will be given of a method of complementing an abnormal nozzle in the comparative example with reference to FIG. 3B.

FIG. 3B shows a case where the nozzle N43 is abnormal and cannot perform discharge. An abnormal nozzle and the resin 114 discharged with the abnormal nozzle are denoted by ● (black circle). In a case where the nozzle N43 is an abnormal nozzle, the resin 114 to be applied onto a position N43P1 cannot be applied. Thus, it is necessary to apply the resin 114 to the vicinity of the position N43P1 using another nozzle. In a case where a position is shifted one grid below the position N43P1, the position reaches a position N43P2, resulting in using the same nozzle N43. On the other hand, a position one grid above the position N43P1 is a position N42P2, where a normal nozzle N42 can be used for application. Therefore, the position is shifted to the position N42P2 to apply the resin 114.

Here, a distance from the resin 114 applied to the position N42P2 to the resin 114 applied to a position N40P2 in the +y direction is four grids, and a distance to the resin 114 applied to a position N45P2 in the −y direction is six grids. That is, in the vicinity of a point where an abnormal nozzle is complemented, an interval between resins is different from that in the other points (5-grid interval). A description will be given of how the resin-114-unfilled defect changes over time in a case where imprinting is performed in this state.

Figure 4:
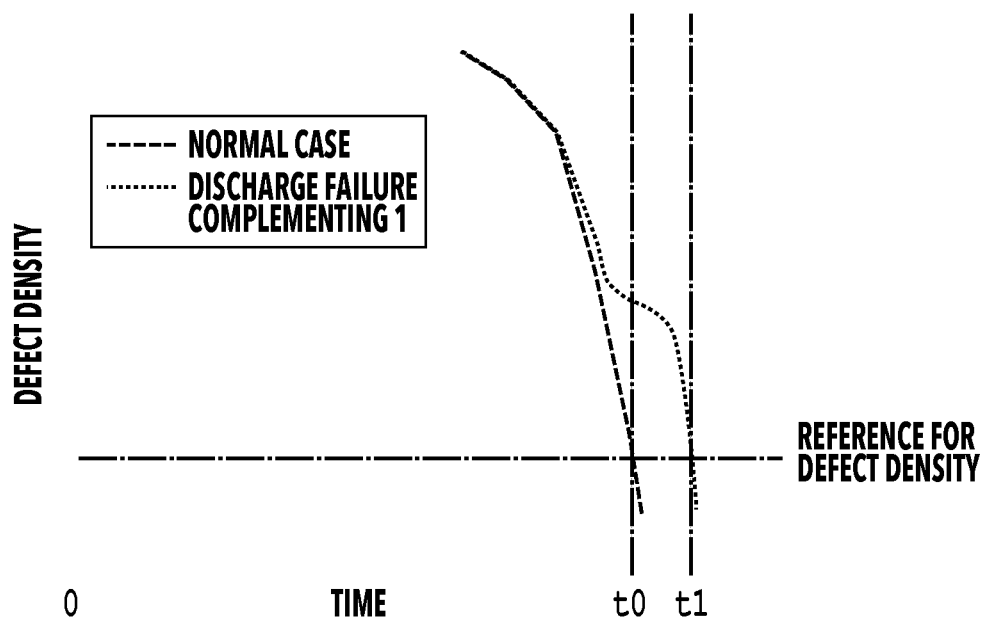
FIG. 4 is a diagram showing a change in an unfilled defect in the comparative example.

FIG. 4 is a diagram showing a change in the unfilled defect by a method of complementing an abnormal nozzle with a near nozzle in the comparative example. The vertical axis represents the amount of an unfilled defect (defect density) and the horizontal axis represents time. Imprinting is started from time 0. In a case where imprinting is started, the resin 114 on the substrate 111 is pressed against the mold 107. As a result, the resin 114 spreads, finally gas between the substrate 111 and the mold 107 is released, and a gap is filled with the resin 114. In a case where there is no abnormal nozzle and the discharge unit 105 is normal, the amount of the unfilled defect gradually decreases over time, and after the time t0 has passed, the amount of the unfilled defect becomes equal to or less than a reference value.

On the other hand, in a case where the resin 114 is applied by a discharge failure complementing method as illustrated in FIG. 3B, filling is performed slowly in a place with wide intervals, and a decrease in defect density is represented by a curve as shown in FIG. 4 as "DISCHARGE FAILURE COMPLEMENTING 1." It takes time t1 for the defect density to fall below a reference, and filling time increases by about 10% as compared with the case of t0. Therefore, time required for imprinting is prolonged, and productivity decreases as a result.

Application Process

First, a description will be given of an overall flow of an application process including abnormal nozzle complementing processing in the present embodiment.

Figure 5:
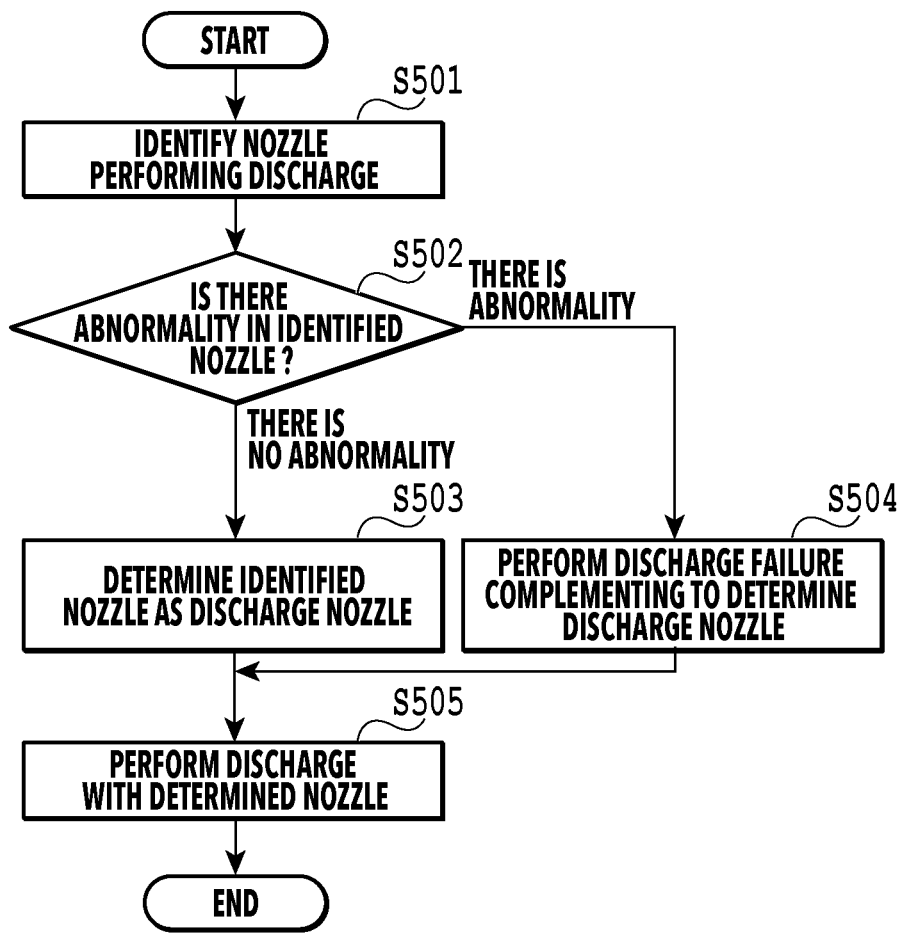
FIG. 5 is a flowchart showing the flow of an application process.

FIG. 5 is a flowchart showing the flow of the application process. This flow is processing executed by each feature of the control unit 106 of the imprint apparatus 101. That is, for example, this flow is executed by the CPU expanding the program stored in the ROM of the control unit 106 into the RAM and executing the program. The symbol "S" in each processing operation means a step in the flow.

This flow is triggered and started by the control unit 106 receiving an instruction (such as pressing an execution button). In S501, the control unit 106 identifies a nozzle performing discharge. At this time, nozzle identification may be performed by acquiring a predetermined discharge pattern and referring to the pattern. Alternatively, a discharge nozzle may be identified based on a drive waveform generated by the control unit 106 itself.

In S502, the control unit 106 uses abnormal nozzle information to determine whether the nozzle identified in S501 is an abnormal nozzle. The abnormal nozzle information is information indicating a result of determination made in advance with respect to all nozzles of the discharge unit 105 by the nozzle abnormality detection unit 200 as to whether there is an abnormality. It is assumed that this abnormal nozzle information is acquired in advance by the control unit 106. In a case where it is determined that there is no abnormality in the identified nozzle, the process proceeds to S503, and in a case where it is determined that there is an abnormality, the process proceeds to S504.

In S503, the control unit 106 determines the nozzle identified in S501 as a discharge nozzle. In S504, the control unit 106 complements the abnormal nozzle using the discharge failure nozzle complementing in the present embodiment and determines a discharge nozzle. Details of the discharge failure nozzle complementing will be described later with reference to FIGS. 6A and 6B.

In S505, the control unit 106 passes information on the determined discharge nozzle to the discharge unit 105. The discharge unit 105 performs application based on the received discharge nozzle information. Then, this flow ends. The above is the flow of the application process of the present embodiment.

Abnormal Nozzle Complementing in the Present Embodiment

Figure 6A:
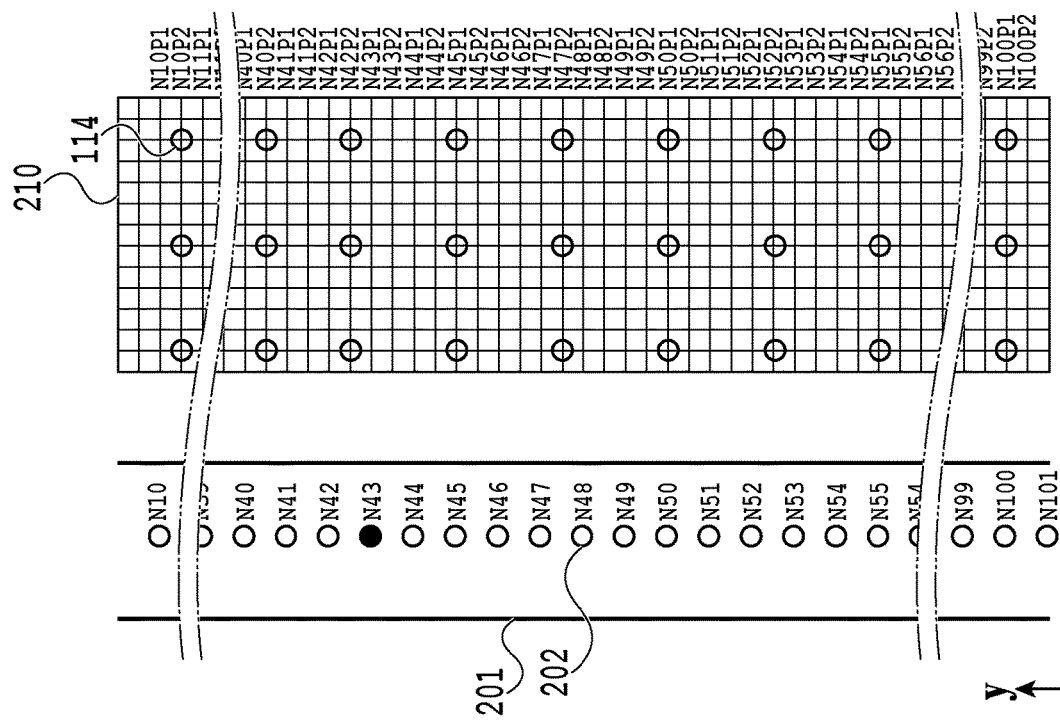
FIGS. 6A and 6B are diagrams showing a method of complementing a discharging defective nozzle.
Figure 6B:
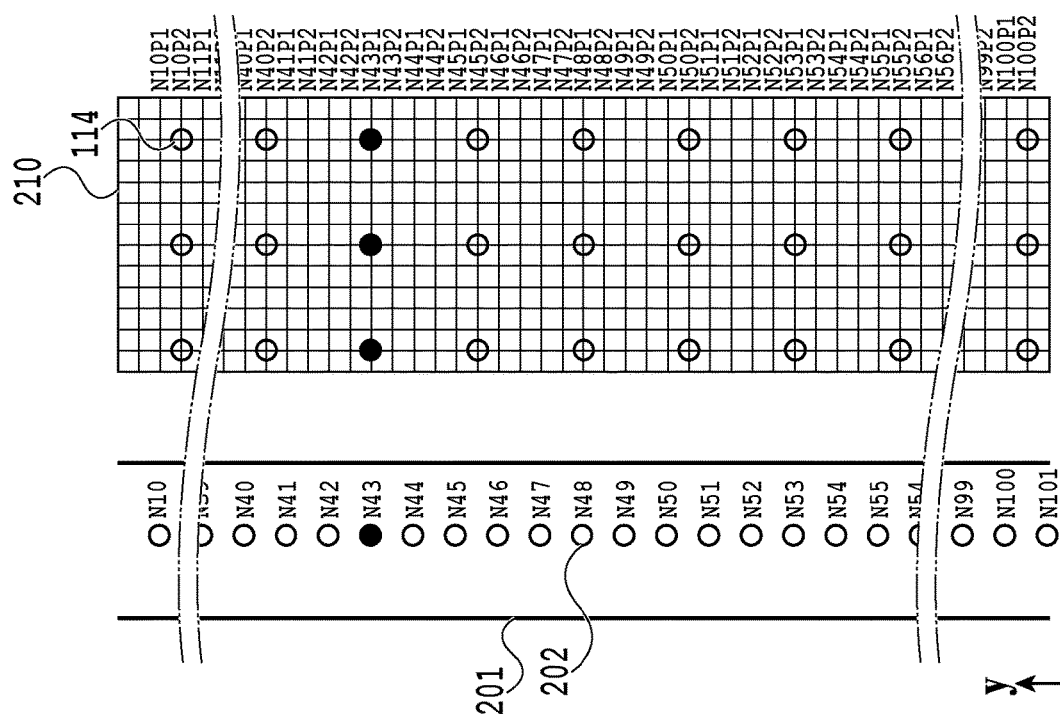

FIGS. 6A and 6B are diagrams illustrating a method of complementing an abnormal nozzle with a near normal alternative nozzle in the present embodiment. FIG. 6A shows a state before discharge failure complementing. In a case where the nozzle N43 is abnormal and cannot perform discharge, the resin 114 cannot be applied onto the position N43P1. As in the method illustrated in FIGS. 3A and 3B, a normal alternative nozzle is used to apply the resin 114 to the vicinity of the position N43P1. That is, a position is shifted by one grid from the position N43P1 in either the +y direction or the -y direction to perform application. In a case where a position is shifted by one grid from the position N43P1 in the -y direction, the same N43 nozzle is used in the position N43P2. Thus, the position is shifted by one grid in the +y direction and the resin is applied to the position N42P2 (that is, the nozzle N42 becomes an alternative nozzle).

Further, all the resins (referred to as internal resins) applied to positions in the -y direction (a direction opposite to the direction from the abnormal nozzle to the alternative nozzle) below the position N42P2 are shifted by one grid in the +y direction as with the N43P1. That is, the positions N45P2, N48P1, N50P2, N53P1, N55P2 . . . are shifted to the positions N45P1, N47P2, N50P1, N52P2, N55P1 . . . to perform application. As a result, an interval between the position N42P2 and the position N40P2 is a 4-grid cycle (n−1), other intervals are a 5-grid cycle (predetermined cycle, n), and there is no longer any location with a wide interval.

Figure 7:
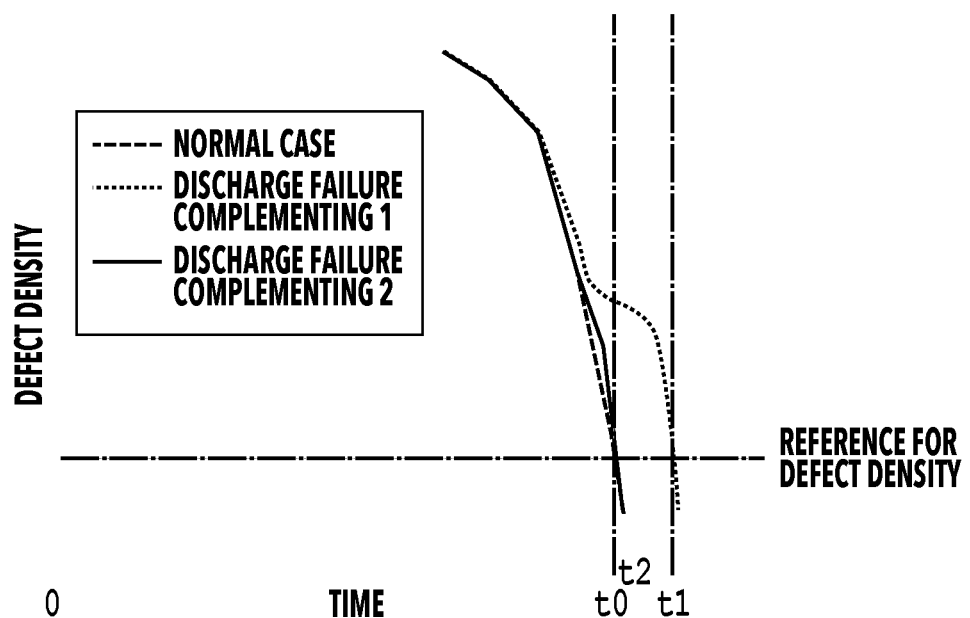
FIG. 7 is a diagram showing a change in an unfilled defect.

FIG. 7 is a diagram showing a calculation result of a defect density in the case of performing nozzle complementing under the method according to the present embodiment. Discharge failure complementing 2 in FIG. 7 is a time change in defect density in the case of applying the resin 114 by the method according to the present embodiment. It can be seen that time until the defect density becomes equal to or less than the reference value is t2, which is substantially equal to t0. Thus, complementing an abnormal nozzle by the method according to the present embodiment prevents an increase in time required for imprinting and can suppress a decrease in productivity.

The interval between the position N40P2 and the position N42P2 is a 4-grid cycle, which is narrower than the 5-grid cycle at the other points. In a case where imprinting is performed in this state, the film thickness of the resin 114 increases only in the region where application has been performed in the 4-grid cycle. Accordingly, it is desirable that a resin in each of the positions N40P2 and N42P2 be discharged in a smaller amount than in the other positions so as not to degrade the film thickness uniformity of the resin.

Figure 8A:
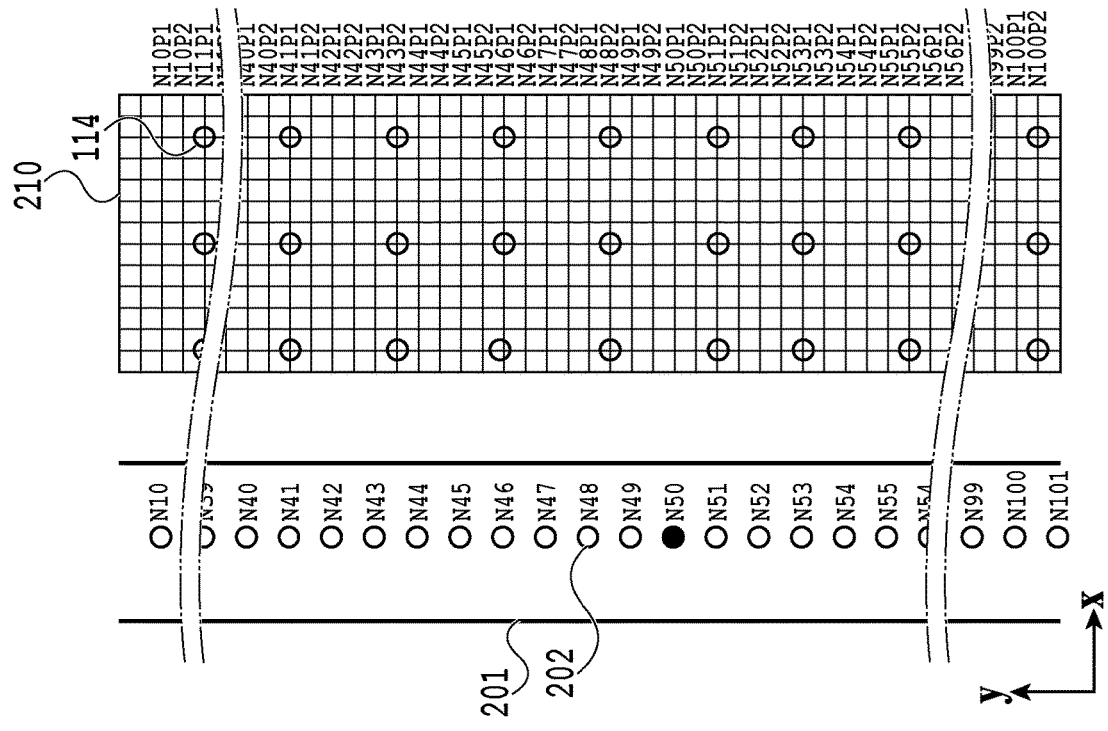
FIGS. 8A and 8B are diagrams showing a method of complementing a discharging defective nozzle.
Figure 8B:
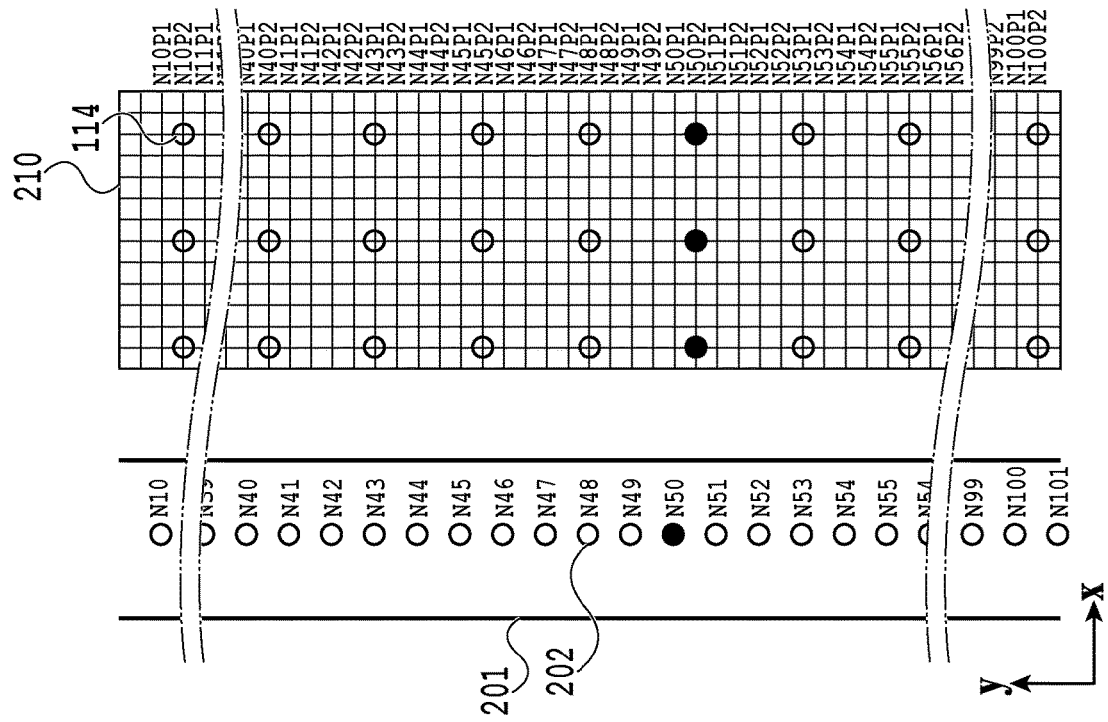

FIGS. 8A and 8B are diagrams showing an example in which a nozzle applying the resin 114 to the return path is abnormal. In a case where the nozzle N50 is abnormal and cannot perform discharge, the resin 114 on the position N50P2 cannot be applied. As in the case of the forward path described above, a normal alternative nozzle is used to apply the resin 114 to the vicinity of the position N50P2. That is, a position is shifted by one grid from the position N50P2 in either the +y direction or the -y direction to perform application. In the case of shifting the position by one grid in the +y direction, the position is shifted to the position N50P1 and the same nozzle N50 is used for discharge. Thus, the position is shifted by one grid in the -y direction to apply the resin to the position N51P1 (that is, the nozzle N51 becomes an alternative nozzle). Further, all the resins (internal resins) applied in the +y direction (a direction opposite to the direction from the abnormal nozzle to the alternative nozzle) above the position N51P1 are shifted in the -y direction by one grid in the same way. That is, positions N48P1, N45P2, N43P1, N40P2 . . . are shifted to positions N48P2, N46P1, N42P2, N41P1 . . . to perform application. As a result, an interval between the position N51P1 and the position N53P1 is a 4-grid cycle, other intervals are a 5-grid cycle, and there is no longer any location with a wide interval. Incidentally, the interval between the position N51P1 and the position N53P1 is a 4-grid cycle, and the density of a resin to be arranged increases, so that it is also desirable that the resin 114 be discharged in a small amount to maintain film thickness uniformity.

As described above, according to the present embodiment, imprint productivity can be improved. Specifically, in the case of complementing an abnormal nozzle, by shifting a resin applied with the abnormal nozzle and an internal resin by one grid, time until the amount of an unfilled defect becomes equal to or less than the reference value can be almost the same as in a case where there is no abnormal nozzle. That is, it is possible to suppress a decrease in productivity without increasing time required for imprinting.

Second Embodiment

A description will be given of the imprint apparatus according to the present embodiment. In the present embodiment, in addition to the complementing method described in the first embodiment, the position of a resin to be applied to each of the upper and lower ends (edge portions) of the substrate will be mentioned.

FIGS. 9A and 9B are diagrams showing a method of complementing an abnormal nozzle in the present embodiment. FIG. 9A shows the resin 114 applied in a 5-grid interval and an edge (mesa edge 301) of the pattern portion 107a. In a case where the mold 107 is pressed, the resin 114 spreads to the mesa edge 301. The resin 114 in the vicinity of the mesa edge is referred to as an edge resin 303, and the rest is referred to as an internal resin 302. In a case where the edge resin 303 is too close to the mesa edge 301, the edge resin 303 spreads to the outside of the mesa edge 301 during imprinting, and the resin 114 bleeds out to the side surface of the pattern portion 107a. In a case where the bleeding resin 114 is cured by UV light, there is a possibility that the cured resin 114 may drop onto the substrate, and in a case where a pattern is imprinted on the resin 114 which has dropped onto the substrate, a defect may be caused in the imprinted pattern. Further, in a case where the edge resin 303 is too far from the mesa edge 301, the edge resin 303 cannot reach the mesa edge 301 during imprinting, resulting in an unfilled state, and there is a possibility that device manufacturing may be adversely affected. Thus, it is required that the distance between the edge resin 303 and the mesa edge 301 be strictly controlled. Then, in the present embodiment, a description will be given of a method of complementing an abnormal nozzle without changing the arrangement of the edge resins 303.

FIG. 9A shows an arrangement of the resins 114 before complementing an abnormal nozzle, where a resin 304 is in the position of the abnormal nozzle. In a case where the resin 304 is applied in the forward path (P1) and the method according to the first embodiment is used, the arrangement of the resins 114 which include the resin 304 and are located on the −y direction side of the resin 304 is shifted by one grid in the +y direction. That is, the position of the edge resin 303 on the −y direction side changes.

FIG. 9B is a diagram showing a method of complementing an abnormal nozzle without changing the arrangement of the edge resins 303. Here, a description will be given of an example of applying the resin 114 in a 5-grid cycle as in FIGS. 3A and 3B with reference to FIG. 9B.

The arrangement of internal resins 302A which include the resin 304 and are located on the −y direction side of the resin 304 is shifted by one grid in the +y direction. At this time, since the position of the edge resin 303 on the −y direction side of the internal resins 302A is not changed, an interval between the resins shown in the position 305A is a 4-grid cycle, and an interval between the resins in the position 306 is a 6-grid cycle.

Here, four more locations where an interval is a 4-grid cycle are provided in a region of the internal resins 302 which include the resin 304 and are located on the −y direction side of the resin 304. The provided positions are referred to as a position 305B, position 306C, position 307D, and position 307E. The positions may be provided in any location as long as resins are not adjacent in the +y direction. As a result, the resin interval in the position 306 is further widened by four grids to ten grids, and this is twice the original cycle. Thus, one resin 114 is applied to the center of 10 grids to achieve a 5-grid cycle which can be used as a basic cycle. Therefore, the abnormal nozzle can be complemented without changing the position of the edge resin 303.

It should be noted that since the resins 114 are more densely arranged in the position 305A, position 305B, position 305C, position 305D, and position 305E than in the other regions, the thickness of each resin 114 is increased by performing imprinting. Thus, a decrease in the amount of discharges of the resins 114 on both sides of the corresponding location makes it possible to maintain film thickness uniformity.

Although the case where a basic resin interval is a 5-grid cycle has been described so far, the complementing method according to the present embodiment can also be applied to cases of other cycles. In a case where the basic resin interval is an n-grid cycle, it is only required that n locations where a resin interval is an n−1 grid cycle be provided.

However, in a case where the number of passes is two as in the present embodiment, it is impossible to avoid an abnormal nozzle in a case where n=1 (1-grid cycle) or n=2 (2-grid cycle). Thus, it is desirable to add a condition that n≥3. In a case where the number of passes is one, it is required that n≥2.

That is, in the case of i passes, since the same nozzle is used to discharge i passes of resins, in a case where a discharge interval is shorter than an i-grid cycle, an abnormal nozzle is always used for discharge. Thus, it is necessary to satisfy n≥i+1.

Third Embodiment

Next, a description will be given of a complementing method in a case where there are a plurality of abnormal nozzles. Also in the present embodiment, a description will be given of a case where the resins 114 are arranged in a 5-grid cycle in the nozzle array direction (y direction).

FIGS. 10A to 10C are diagrams showing a method of complementing an abnormal nozzle in the present embodiment. First, FIG. 10A before the abnormal nozzle is complemented will be described. In the present embodiment, there are two resins 304P1A and 304P1D corresponding to abnormal nozzles in the forward path (P1) and two resins 304P2B and 304P2C corresponding to abnormal nozzles in the return path (P2).

The operation of the 304P1A, which is the uppermost resin of resins corresponding to abnormal nozzles in the forward path, is firstly started. Since the 304P1A is in the forward path (P1), internal resins on the lower side including the 304P1A are shifted by one grid in the +y direction to create a position 305A in a 4-grid cycle.

FIG. 10B is a diagram showing a case where the internal resins including the 304P1A, excluding the edge resin 303, and located on the −y direction side of the 304P1A (that is, resins corresponding to the internal resins 302A) are shifted by one grid in the +y direction. Since the 304P2C and 304P1D are included in the internal resins, the positions are shifted by one grid in the +y direction. At this time, since the 304P1D is in the forward path (P1), in the case of being shifted in the +y direction by one grid, a return path (P2) for other normal nozzles is used for application. On the other hand, since the 304P2C is in the return path (P2), even in a case where shift occurs in the +y direction by one grid, the forward path (P1) for the same nozzle is used for application, so that the resin is not discharged normally yet.

Then, internal resins 302C including the 304P1C and located on the lower side of the 304P1C are shifted upward by one grid to create a position 305B in a 4-grid cycle. As a result, an adjacent nozzle is used for application, and the resin is normally applied. Since two locations 305A and 305B in a 4-grid cycle are obtained through the operations up to this point, in order not to change the position of the edge resin, three locations, a position 305C, position 305D, and position 305E, in a 4-grid cycle are created below the location 305B. As a result, intervals between all resins on the −y direction side of the position 305E return to a 5-grid cycle.

Next, performing the same operation for the internal resins 302D including the 304P2B and located on the +y direction side of the 304P2B also makes it possible to complement resins discharged with abnormal nozzles in the +y direction above the 304P2B. FIG. 10C is a diagram in which five locations in a 4-grid cycle are created and one resin is added onto the edge resin 303. Complementing of all abnormal nozzles is completed as described above.

It should be noted that there is a case where in the case of creating a location in a 4-grid cycle, a resin newly corresponds to an abnormal nozzle. In that case, it is only required that the above-described operations be repeated for the location newly corresponding to the abnormal nozzle. In a case where there are a large number of abnormal nozzles, it may be necessary to create five or more locations in a 4-grid cycle. In that case, creating a total of 10 locations in a 4-grid cycle makes it possible to achieve a 5-grid cycle again. In a case where there are a number of abnormal nozzles which cannot be treated even by creating a total of 10 locations in a 4-grid cycle, the discharge unit 105 may be replaced.

A more general description of the present embodiment will be given. First, a description will be given of a case where the number of passes is two and a cycle n (grid) is an even number. As described above, among resins corresponding to abnormal nozzles in the forward path, a resin located at the end in the +y direction is found to operate internal resins located on the −y direction side of the resin. A nozzle that discharges a resin located at the end on the +y direction side among the resins corresponding to the abnormal nozzles in the forward path will be referred to as a NOZ1. In a case where there is another abnormal nozzle (referred to as a NOZ2) in a region of internal resins to be operated, there is a case where a resin shifted by performing a complementing operation is applied with this abnormal nozzle. Specifically, in a case where the NOZ2 is in an m*(n/2)−1th (m is a natural number) position from the NOZ1, the shifted resin is applied to the NOZ2. In this case, applying a resin such that there are at least two locations in a (n−1) grid cycle between the NOZ1 and NOZ2 makes it possible to avoid application using the NOZ2. Since a location in the (n−1) grid cycle is created, a location in the (n−1) grid cycle is appropriately created on the −y direction side of the NOZ2 so as not to change the position of the edge resin 303.

In a case where the number of passes is two and the cycle n is an odd number, if the NOZ2 is in an m*n−1th (m is a natural number) position from the NOZ1, the shifted resin is applied to the NOZ2. Accordingly, even in a case where the cycle n of the basic arrangement of resins is an odd number, applying a resin so that there are at least two locations in a (n−1) grid cycle between the two makes it possible to avoid application using the NOZ2. Similarly, the position of the edge resin 303 can be maintained by appropriately creating a location in the (n−1) grid cycle on the −y direction side of the NOZ2.

In a case where the number of passes is one, if the NOZ2 is in the m*n−1th (m is a natural number) position from the NOZ1 at the end in the +y direction of abnormal nozzles, the shifted resin is applied to the NOZ2. Therefore, also in this case, it is possible to avoid resin application using the NOZ2 by applying a resin so that there is at least one location in the (n−1) grid cycle between the NOZ1 and NOZ2.

It should be noted that in a case where there is the NOZ2 in a position other than the m*n−1th position from the NOZ1, the shifted resin associated with the complementing of the NOZ1 is not applied to the NOZ2. Therefore, in this case, even in a case where there are a plurality of abnormal nozzles, it is only required that the NOZ1 be complemented without considering the NOZ2. The same applies to a case where the number of passes is two.

The above is a general complementing method in a case where there are a plurality of abnormal nozzles in the present embodiment. In the present embodiment, in a case where there are a plurality of abnormal nozzles, complementing proceeds by focusing on a resin located at the end in the +y direction among resins corresponding to abnormal nozzles in the forward path, but the present disclosure is not limited to this in reality. For example, the complementing may proceed by focusing on a resin at the end in the −y direction among resins corresponding to abnormal nozzles in the return path.

Other Embodiments

Embodiment(s) of the present disclosure can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present disclosure has been described with reference to embodiments, it is to be understood that the disclosure is not limited to the disclosed embodiments. The scope of the following claims is to be accorded the broadest interpretation so as to encompass all such modifications and equivalent structures and functions.

This application claims the benefit of priority from Japanese Patent Application No. 2022-021373, filed Feb. 15, 2022, which is hereby incorporated by reference wherein in its entirety.

What is claimed is:

1. An imprint apparatus comprising:
a discharge unit including a nozzle array in which a plurality of nozzles are arranged in a nozzle array direction;
a moving unit configured to move relative positions of a substrate and the discharge unit; and
a discharge control unit configured to perform control so as to apply a resin to the substrate by applying a resin from a nozzle corresponding to a predetermined cycle in the nozzle array direction in the discharge unit and by moving the relative positions by the moving unit, the imprint apparatus comprising:
an identifying unit configured to identify a discharging defective nozzle in the discharge unit; and
a complementing unit configured to, in a case where the nozzle corresponding to the predetermined cycle includes a discharging defective nozzle, complement the discharging defective nozzle with an alternative nozzle near the discharging defective nozzle,
wherein the complementing unit determines a nozzle to be used for discharge so that there is at least one location where a cycle of nozzles applying a resin in the nozzle array direction is n−1 in a case where the predetermined cycle is n, and the resin is applied to another location in the predetermined cycle n, and
wherein the complementing unit determines a nozzle applying the resin without changing a position of a resin near a mesa edge.

2. The imprint apparatus according to claim 1, wherein in a case where the predetermined cycle is n and where a number of passes to move the relative positions is i, n≥i+1 is satisfied.

3. The imprint apparatus according to claim 1, wherein the other location is a location located on a side of a direction opposite to a direction from the discharging defective nozzle to the alternative nozzle in the nozzle array direction relative to the discharging defective nozzle.

4. The imprint apparatus according to claim 1, wherein the discharge control unit reduces a discharge amount of the resin in a location where the cycle is n−1 to less than a discharge amount of a resin in a location where the cycle is n.

5. The imprint apparatus according to claim 1, wherein the mesa edge is a mesa edge on a side of a direction opposite to a direction from the discharging defective nozzle to the alternative nozzle in the nozzle array direction relative to the discharging defective nozzle.

6. The imprint apparatus according to claim 1, wherein the complementing unit determines a nozzle to be used for discharge so that there are n locations where a cycle is n−1 between a resin applied with the alternative nozzle and a resin near the mesa edge.

7. The imprint apparatus according to claim 2, wherein in a case where the nozzle corresponding to the predetermined cycle includes a plurality of discharging defective nozzles and where the number of passes is one, in a case where there is another discharging defective nozzle in an m*n−1th position from the discharging defective nozzles, wherein m is a natural number, the complementing unit determines a nozzle to be used for discharge so that there is at least one location where the cycle is n−1 between the other discharging defective nozzle and the discharging defective nozzles.

8. The imprint apparatus according to claim 2, wherein in a case where the nozzle corresponding to the predetermined cycle includes a plurality of discharging defective nozzles, where the number of passes is two, and where the cycle n is an even number,
in a case where among discharging defective nozzles applying a resin in a forward path, a nozzle nearest to an end in the nozzle array direction is a first discharging defective nozzle and another discharging defective nozzle located in an m*(n/2)−1th position from the first discharging defective nozzle in a direction opposite to a direction from the first discharging defective nozzle to the alternative nozzle corresponding to the first discharging defective nozzle is a second discharging defective nozzle, wherein m is a natural number,
the discharge control unit determines a nozzle to be used for discharge so that there are at least two locations where the cycle is n−1 between the first discharging defective nozzle and the second discharging defective nozzle.

9. The imprint apparatus according to claim 2, wherein in a case where the nozzle corresponding to the predetermined cycle includes a plurality of discharging defective nozzles, where the number of passes is two, and where the cycle n is an odd number,
in a case where among discharging defective nozzles applying a resin in a forward path, a nozzle nearest to an end in the nozzle array direction is a first discharging defective nozzle and another discharging defective nozzle located in an m*n−1th position from the first discharging defective nozzle in a direction opposite to a direction from the first discharging defective nozzle to the alternative nozzle corresponding to the first discharging defective nozzle is a second discharging defective nozzle, wherein m is a natural number,
the discharge control unit determines a nozzle to be used for discharge so that there are at least two locations where the cycle is n−1 between the first discharging defective nozzle and the second discharging defective nozzle.

10. The imprint apparatus according to claim 8, wherein the end is an end in a direction from the discharging defective nozzle to an alternative nozzle complementing the discharging defective nozzle.

11. A method of controlling an imprint apparatus comprising:
a discharge unit including a nozzle array in which a plurality of nozzles are arranged in a nozzle array direction;
a moving unit configured to move relative positions of a substrate and the discharge unit; and
a discharge control unit configured to perform control so as to apply a resin to the substrate by applying a resin from a nozzle corresponding to a predetermined cycle in the nozzle array direction in the discharge unit and by moving the relative positions by the moving unit, the method comprising:
identifying a discharging defective nozzle in the discharge unit; and
in a case where the nozzle corresponding to the predetermined cycle includes a discharging defective nozzle, complementing the discharging defective nozzle with an alternative nozzle near the discharging defective nozzle,
wherein the complementing comprises determining a nozzle to be used for discharge so that there is at least one location where a cycle in the nozzle array direction is n−1 in a case where the predetermined cycle is n, and the resin is applied to another location in the predetermined cycle n, and wherein the complementing determines a nozzle applying the resin without changing a position of a resin near a mesa edge.

12. A non-transitory computer readable storage medium storing a program which causes a computer to function as a discharge unit including a nozzle array in which a plurality of nozzles are arranged in a nozzle array direction; a moving unit configured to move relative positions of a substrate and the discharge unit; and a discharge control unit configured to perform control so as to apply a resin to the substrate by applying a resin from a nozzle corresponding to a predetermined cycle in the nozzle array direction in the discharge unit and by moving the relative positions by the moving unit, the program causing the computer to function as an identifying unit configured to identify a discharging defective nozzle in the discharge unit; and a complementing unit configured to, in a case where the nozzle corresponding to the predetermined cycle includes a discharging defective nozzle, complement the discharging defective nozzle with an alternative nozzle near the discharging defective nozzle, wherein the complementing unit determines a nozzle to be used for discharge so that there is at least one location where a cycle of nozzles applying a resin in the nozzle array direction is n−1 in a case where the predetermined cycle is n, and the resin is applied to another location in the predetermined cycle n, and wherein the complementing unit determines a nozzle applying the resin without changing a position of a resin near a mesa edge.

* * * * *